United States Patent
Cheng et al.

(10) Patent No.: US 11,925,128 B2
(45) Date of Patent: Mar. 5, 2024

(54) DIFFERENTIAL IONIC ELECTRONIC TRANSISTORS

(71) Applicant: Robert Bosch GmbH, Stuttgart (DE)

(72) Inventors: Lei Cheng, San Jose, CA (US);
Thomas Rocznik, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 823 days.

(21) Appl. No.: 17/003,601

(22) Filed: Aug. 26, 2020

(65) Prior Publication Data

US 2022/0069206 A1 Mar. 3, 2022

(51) Int. Cl.
*H10N 70/20* (2023.01)
*G11C 13/00* (2006.01)
*H10N 70/00* (2023.01)

(52) U.S. Cl.
CPC .......... *H10N 70/24* (2023.02); *G11C 13/0011* (2013.01); *H10N 70/823* (2023.02); *H10N 70/826* (2023.02); *H10N 70/8416* (2023.02); *H10N 70/8836* (2023.02)

(58) Field of Classification Search
CPC .... H10N 70/24; H10N 70/823; H10N 70/826; H10N 70/8416; H10N 70/8836
See application file for complete search history.

(56) References Cited

U.S. PATENT DOCUMENTS

| 10,429,343 B1 | 10/2019 | Talin et al. |
| 10,497,866 B1 | 12/2019 | Fuller et al. |
| 2020/0066338 A1* | 2/2020 | Noshiro .............. G11C 13/0011 |

OTHER PUBLICATIONS

Li et al., "Low-Voltage, CMOS-Free Synaptic Memory Based on LiXTiO2 Redox Transistors", ACS Appl. Mater. Interfaces 2019, 11, 42, 38982-38992, Sep. 27, 2019, 12 pages.

* cited by examiner

*Primary Examiner* — Samuel A Gebremariam
(74) *Attorney, Agent, or Firm* — Brooks Kushman P.C.

(57) ABSTRACT

An ionic transistor including a first source, a first drain spaced apart from the first source, and a first storage layer electrically connected to the first source and the first drain. The ionic transistor also includes a second source spaced apart from the first source, a second drain spaced apart from the second source, and a second storage layer electrically connected to the second source and the second drain. The ionic transistor further includes an electrolyte layer situated between and electrically connected to the first and second storage layers. The ionic transistor may be implemented as non-volatile memory in a machine learning (ML) application.

20 Claims, 4 Drawing Sheets

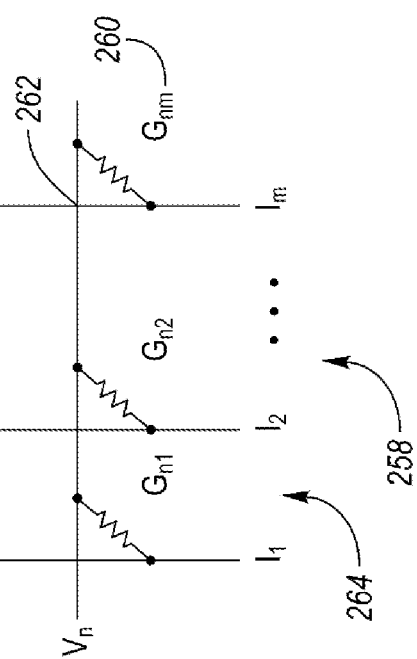
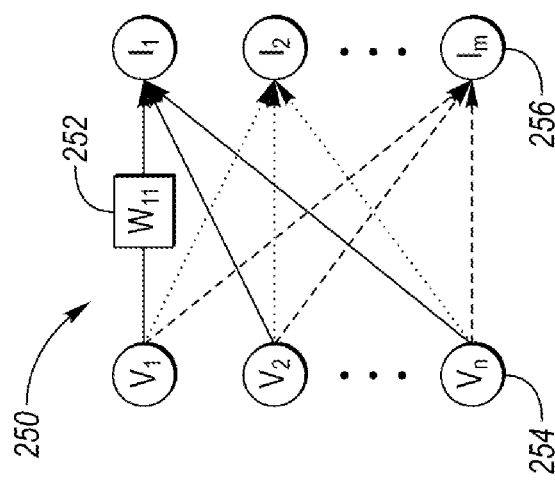
FIG. 8A
FIG. 8B
FIG. 8C

DIFFERENTIAL IONIC ELECTRONIC TRANSISTORS

TECHNICAL FIELD

The present disclosure relates to differential ionic electronic transistors. The differential ionic transistors may be used in the implementation of machine learning (ML) algorithms.

BACKGROUND

Machine learning (ML) algorithms and artificial intelligence are making rapid advances and are seeing increased implementation across a broad spectrum of technologies. ML algorithms encompass computer algorithms configured to improve automatically through experience. ML algorithms are considered a subset of artificial intelligence. ML algorithms use sample data (i.e. training data) to make decisions without explicit programming relating thereto. The implementation of ML algorithms may use a tremendous amount of computing power and may consume a significant amount of energy to implement. The implementation of ML algorithms may be limited by data transfer constraints between computing unit and memory, where the memory is constantly updated with neutral network weights values. Start of the art memory technology proposals use CMOS. CMOS may consume large amounts of energy for writes and updates. This is not ideal for application into embedded systems where resources are scarce and limited. There remains a need to develop computing devices (e.g. non-volatile memory devices) to reduce the amount of power consumption relating to the implementation of ML algorithms.

SUMMARY

According to one embodiment, an ionic transistor is disclosed. The ionic transistor includes a first source, a first drain spaced apart from the first source, and a first storage layer electrically connected to the first source and drain. The ionic transistor also includes a second source spaced apart from the first source, a second drain spaced apart from the second source, and a second storage layer electrically connected to the second source and drain. The ionic transistor further includes an electrolyte layer situated between and electrically connected to the first and second storage layers.

According to another embodiment, an ionic transistor is disclosed. The ionic transistor includes a first source, a first drain spaced apart from the first source, and a first storage layer electrically connected to the first source. The ionic transistor includes a second source spaced apart from the first source, a second drain spaced apart from the second source, and a second storage layer electrically connected to the second source and drain. The ionic transistor also includes an electrolyte layer situated between and electrically connected to the first and second channels. The first drain, source and storage layer and/or the second drain, source and storage layer form a first substantially planar layer and/or a second substantially planar layer, respectively.

According to yet another embodiment, an ionic transistor is disclosed. The ionic transistor includes a first source, a first drain spaced apart from the first source, and a first storage layer electrically connected to the first source and drain. The ionic transistor further includes a second source spaced apart from the first source, a second drain spaced apart from the second source, and a second storage layer electrically connected to the second source and drain. The ionic transistor further includes an electrolyte layer situated between and electrically connected to the first and second storage layers. The first drain, source and storage layer have a first cross-sectional profile about a first primary axis. The second drain, source and storage layer have a second cross-sectional profile about a second primary axis. The first cross-sectional profile is asymmetrical the second cross-sectional profile.

BRIEF DESCRIPTION OF THE DRAWINGS

FIGS. 8a, 8b and 8c depict schematic diagrams of an analog multiply-accumulate unit configured to implement the ionic transistors of one or more embodiments.

DETAILED DESCRIPTION

Figure 1:
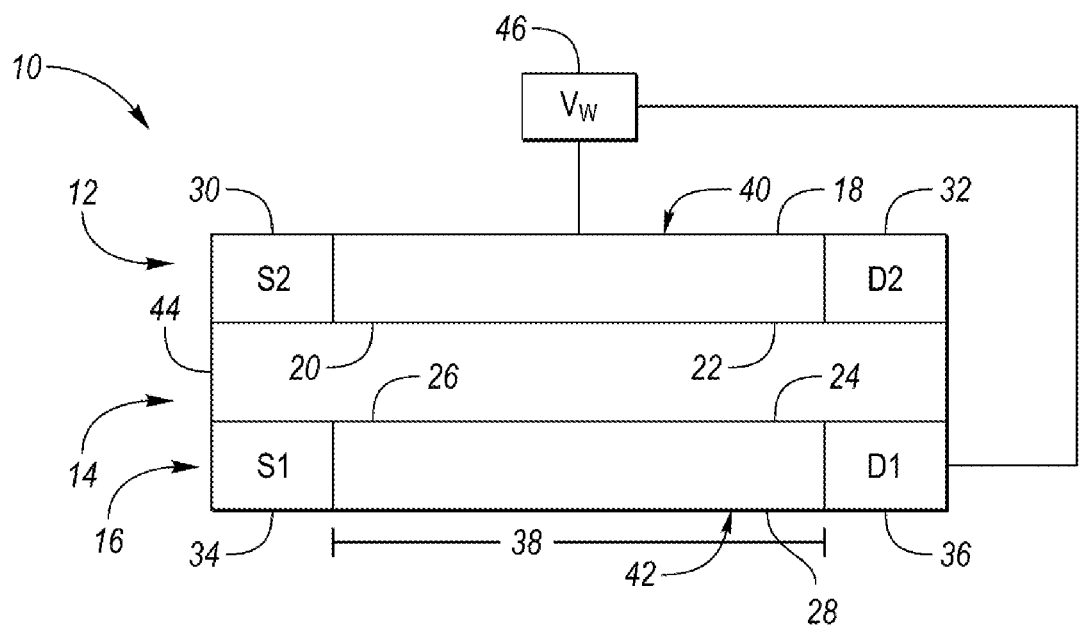
FIG. 1 depicts a schematic, side view of an ionic transistor according to a first embodiment.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

This present disclosure is not limited to the specific embodiments and methods described below, as specific components and/or conditions may, of course, vary. Furthermore, the terminology used herein is used only for the purpose of describing embodiments of the present disclosure and is not intended to be limiting in any way.

As used in the specification and the appended claims, the singular form "a," "an," and "the" comprise plural referents unless the context clearly indicates otherwise. For example, reference to a component in the singular is intended to comprise a plurality of components.

The description of a group or class of materials as suitable for a given purpose in connection with one or more embodiments implies that mixtures of any two or more of the members of the group or class are suitable. Description of constituents in chemical terms refers to the constituents at the time of addition to any combination specified in the description and does not necessarily preclude chemical interactions among constituents of the mixture once mixed.

Except where expressly indicated, all numerical quantities in this description indicating dimensions or material properties are to be understood as modified by the word "about" in describing the broadest scope of the present disclosure.

The first definition of an acronym or other abbreviation applies to all subsequent uses herein of the same abbreviation and applies mutatis mutandis to normal grammatical variations of the initially defined abbreviation. Unless expressly stated to the contrary, measurement of a property is determined by the same technique as previously or later referenced for the same property.

The term "substantially" or "about" may be used herein to describe disclosed or claimed embodiments. The term "substantially" or "about" may modify any value or relative characteristic disclosed or claimed in the present disclosure. "Substantially" or "about" may signify that the value or relative characteristic it modifies is within ±0%, 0.1%, 0.5%, 1%, 2%, 3%, 4%, 5% or 10% of the value or relative characteristic.

Reference is being made in detail to compositions, embodiments, and methods of embodiments known to the inventors. However, the disclosed embodiments are merely exemplary of the present disclosure which may be embodied in various and alternative forms. Therefore, specific details disclosed herein are not to be interpreted as limiting, rather merely as representative bases for teaching one skilled in the art to variously employ the present disclosure.

Machine learning (ML) algorithms and artificial intelligence are making rapid advances and are seeing implementation across a broad spectrum of technologies. However, state of the art computing devices implementing ML algorithms may be energy intensive. For instance, metal oxide semiconductors (CMOS) may not be suitable for low power consumption in embedded systems. The scaling down of these systems may encounter physical limitations.

This is a significant barrier for application of ML algorithms in embedded systems where resources are generally constrained (e.g. remote sensor, mobile devices). Additionally, embedded systems may operate in complex environments susceptible to temperature fluctuations. These temperature fluctuations may negatively influence the performance and computational reliability of a semiconductor device implementing the ML algorithm.

A recent effort has been made to move the calculation for inference of ML algorithms into memory. This approach may eliminate the need for a large amount data transfer because weights are stored in memristor and multiplication operations can be computed using Ohms law at the same place. Additionally, sums can be calculated using Kirchhoff s law, which builds on a multiply-accumulate unit. Furthermore, memory cells may be fabricated with high densities to implement large network structures. However, several limitations exist with current solutions. One limitation is precision and repeatability of programming of memory levels in memristor, otherwise known as weights. Another limitation may be related to temperature instability and/or dependency.

What is needed is a computing memory device that overcomes one or more of these limitations.

In one or more embodiments, differential ionic transistors are disclosed that at least partially address one or more of the limitations set forth above. The ionic transistors may be configured in differential transistor modes as non-volatile, temperature independent analog and/or digital computing devices, which can be used for ML applications. The ionic transistors of one or more embodiments may utilize a coupled charged vacancy formation mechanism for precise control of conductance and/or resistance differential control. The ionic transistors of one or more embodiments may utilize a coupled charged ion intercalation and deintercalation mechanism for precise control of conductance and/or resistance differential control. One or more devices implementing these ionic transistors may enable temperature independent multi-state switches of the ionic transistor with high power efficiency in nJ per operation. The ionic transistors of one or more embodiments may be used in integrated circuits of embedded systems (e.g. devices working in harsh conditions).

FIG. 1 depicts a schematic, side view of ionic transistor 10. Ionic transistor 10 includes upper layer 12, middle layer 14 and lower layer 16. Middle layer 14 extends between upper layer 12 and lower layer 16. Upper layer 12 includes first and second surfaces 18 and 20. Middle layer 14 includes first and second surfaces 22 and 24. Lower layer 16 includes first and second surfaces 26 and 28. Second surface 20 of upper layer 12 contacts first surface 22 of middle layer 14 to form an electrical connection between upper layer 12 and middle layer 14. First surface 26 of lower layer 16 contacts second surface 24 of middle layer 14 to form an electrical connection between lower layer 16 and middle layer 14.

Ionic transistor 10 and the layers 12, 14 and 16 thereof may each have a planar configuration. In one or more embodiments, the planar configuration is symmetrical about an x-axis and/or a y-axis of ionic transistor 10. The thickness of ionic transistor 10 may be any of the following values or in a range of any two of the following values: 80, 85, 90, 95, 100, 105, 110, 115 and 120 nanometers (nm). The thickness of layers 12, 14 and/or 16 may be independently selected from any of the following values or in a range of any two of the following values: 20, 25, 30, 35 and 40 nm.

Upper layer 12 includes first and second contacts 30 and 32. First and second contacts 30 and 32 may formed of an electrically conductive material, such as a metal material. Lower layer 16 includes first and second contacts 34 and 36. First and second contacts 34 and 36 may be formed of an electrically conductive material, such as a metal material. As shown in FIG. 1, first contacts 30 and 34 are source contacts S2 and S1 respectively. As further shown in FIG. 1, second contacts 32 and 36 are drain contacts D2 and D1, respectively. Channel 38 extends between first and second contacts 30 and 32 of upper layer 12 and between first and second contacts 34 and 36 of lower layer 16.

Upper storage layer 40 and lower storage layer 42 are situated in channel 38. Upper storage layer 40 extends between first and second contacts 30 and 32 of upper layer 12. Lower storage layer 42 extends between first and second contacts 34 and 36 of lower layer 16. Upper and/or lower storage layers 40 and/or 42 may be formed of an electrically conductive material that is configured to conduct ions (e.g. positive hydrogen ions). The electrically conductive material may be configured to demonstrate electronic conductivity with different ion concentrations. The electrically conductive material may be a lithium (Li) containing compound (e.g. a composition having a formula $Li_xMO_y$, where M is a transition metal, x is the number of Li atoms in the composition and y is the number of O atoms in the composition), a sodium (Na) containing compound (e.g. a composition having a formula $Na_xMO_y$, where M is a transition metal, x is the number of Na atoms in the composition and y is the number of O atoms in the composition), an oxygen ionic conductor (e.g. a material having an $ABO_3$ perovskite cubic structure, where the type A atom sits at a cube corner position (0, 0, 0), the type B atoms sits at a body-center position (½, ½, ½), and the O atoms sit at face centered positions (½, ½, 0), (½, 0, ½) and (0, ½, ½), or a binary transition metal oxide having a general formula $AO_x$) or a combination thereof. The Li containing compound may have any of the following formulations: Li—Ti—O (e.g. $Li_7Ti_5O_{12}$), Li—Mn—O (e.g. $LiMnO_2$), Li—Ni—O (e.g. $LiNiO_2$), Li—Co—O (e.g. $LiCoO_2$), Li—Mn—Co—Ni—O (e.g. $Li(MnNiCo)O_2$), Li—Nb—O (e.g. $LiNbO_2$), Li—V—O (e.g. $LiVO_2$), Li—Fe—F (e.g. $LiFeF_3$), and combinations thereof. The Na containing compound may have any of the following formulations: Na—V—P—O (e.g. $NaV_2(PO_4)_3$), Na—Ti—O (e.g. $NaTiO_2$), and combinations thereof. Non-limiting examples of $ABO_3$ perovskite cubic structures include $La_{0.8}Sr_{0.2}MnO_3$, $La_{0.6}Sr_{0.4}Co_{0.2}Fe_{0.8}O_3$, $Gd_{0.1}Ce_{0.9}O_2$, $Sm_{0.2}Ce_{0.8}O_{0.2}$, and $SrCoO_3$. Non-limiting examples of binary transition metal oxides includes $FeO_x$, $TiO_x$, $NiO_x$ and combinations thereof. Upper and/or lower storage layers 40 and/or 42 may be formed of any mixed conducting material configured for ionic movement, including without limitation oxygen-conducting materials, sodium-conducting materials, potassium-conducting materials and combinations thereof.

In one embodiment, upper storage layer 40 is formed of a material having a formula $Li_{0.5-n}MO_x$, where M is a transition metal, and lower storage material 42 is formed of a material having a formula $Li_{0.5+n}MO_x$. Source S2 and drain D2 are connected to first and second ends of upper storage layer 40. Source S1 and D1 are connected to first and second ends of lower storage layer 42. Upper storage layer 40 and lower storage layer 42 may be formed of a same material or different materials.

Middle layer 14 is comprised of solid electrolyte 44. Solid electrolyte 44 is configured to contact upper and lower storage layers 40 and 42. Solid electrolyte 44 is configured to conduct ions (e.g. positive hydrogen ions) from and to upper and lower storage layers 40 and 42. In one or more embodiments, solid electrolyte 44 is an electrical insulator configured to prevent electrons from passing therethrough but allowing ions to pass therethrough. Solid electrolyte 44 may be a high dielectric constant material (e.g. a relative permittivity of 3.9 to 250,000). The high dielectric constant material may be a lithium ionic conductor material, an oxygen ionic conductor material, sodium ion conductor and combinations thereof. The Li containing material may be $Li_7La_3Zr_2O_{12}$, $LiAlO_2$, LiF, LiI, LiBr, $Li_7P_2S_7$, $Li_7P_2SI_6$. The oxygen ionic conductor material may be $Y_{0.16}Zr_{0.92}O_2$. The sodium ion conductor may be $Na_{3+2x}Zr_{2-x}M_xSi_2PO_{12}$ (M is another metal atom).

Upper storage layer 40 may be a gate or a portion of a gate (e.g. a floating gate). In one or more embodiments, ionic transistor 10 is electrically connected to the gate. The gate may be electrically connected to a switch (not shown). The switch may be electrically connected to a contact (not shown). Voltage source 46 is configured to apply a voltage pulse to the contact, thereby applying the voltage pulse to the switch, which in turn applies the voltage pulse to ionic transistor 10.

As shown in FIG. 1, a write voltage ($V_W$) is applied to ionic transistor. When a positive voltage is applied as the write voltage ($V_W$), ions (e.g. Li ions in the case of a Li containing material) are transported from upper storage layer 40 through solid electrolyte 44 to lower storage layer 42. As ions diffuse from upper storage layer 40 through solid electrolyte 44, an electronic resistance of upper storage layer 40 increases and a conductance of upper storage layer 40 decreases. Lower storage layer 42 is configured to intercalate the ions from upper storage layer 40 such that an electronic resistance of lower storage layer 42 decreases and a conductance of lower storage layer 42 increases. Accordingly, in one mode of operation, in which a positive voltage is applied to upper storage layer 40, the electronic resistance and conductance of upper storage layer 40 increases and decreases, respectively, while the electronic resistance and conductance of lower storage layer 42 decreases and increases, respectively. This process may be reversed (i.e. reverse the ion flow and electrical characteristics of the upper and lower storage layers 40 and 42) by applying a negative voltage to upper storage layer 40 instead of a positive voltage. The reversibility of ionic transistor 10 is configured to provide at least three (3) differential states of operation of ionic transistor 10. In one or more embodiments, the state reading is temperature independent.

Ionic transistor 10 may be operated at a low voltage (e.g. a range of 100 mV to 5 V) to reduce the amount of power consumption relative to other transistors that operate by measuring applied voltage or current. Ionic transistor 10 is configured to operate by counting an ionic charge, not by applying voltage or current.

Figure 2:
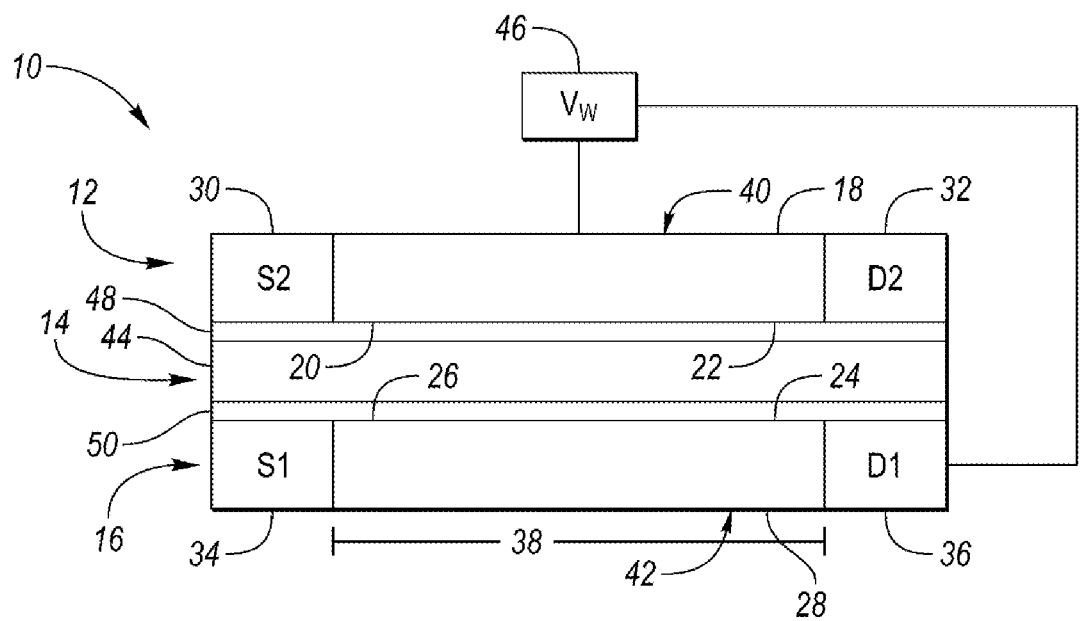
FIG. 2 depicts a schematic, side view of the ionic transistor shown in FIG. 1 and further including upper and lower coatings.

FIG. 2 depicts a schematic, side view of ionic transistor 10 including upper and lower coatings 48 and 50. Upper coating 48 is situated between upper layer 12 and middle layer 14. In another embodiment, ionic transistor 10 includes only one of upper and lower coatings 48 and 50. Lower coating 50 is situated between lower layer 12 and middle layer 14. During fabrication of ionic transistor 10, first surface 22 of middle layer 14 may be coated with upper coating 48. Alternatively, second surface 20 of upper layer 12 may be coated with upper coating 48. During fabrication of ionic transistor 10, second surface 22 of middle layer 14 may be coated with lower coating 48. Alternatively, first surface 26 of lower layer 16 may be coated with lower coating 50. The thickness of upper and/or lower coatings 48 and/or 50 may be independently selected from any of the following thicknesses or in a range of any two of the following thicknesses: 1.0, 1.1, 1.2, 1.3, 1.4, 1.5, 1.6, 1.7, 1.8, 1.9 and 2.0 nanometers. The upper and/or lower coatings 48 and/or 50 can be configured to decrease the interfacial contact resistance between upper layer 12 and middle layer 14 and/or middle layer 14 and lower layer 16. Non-limiting examples of coating materials that can be used for upper and/or lower coatings 48 and/or 50 include LiF, $Li_2O$ and $Li_2O_2$.

Figure 3:
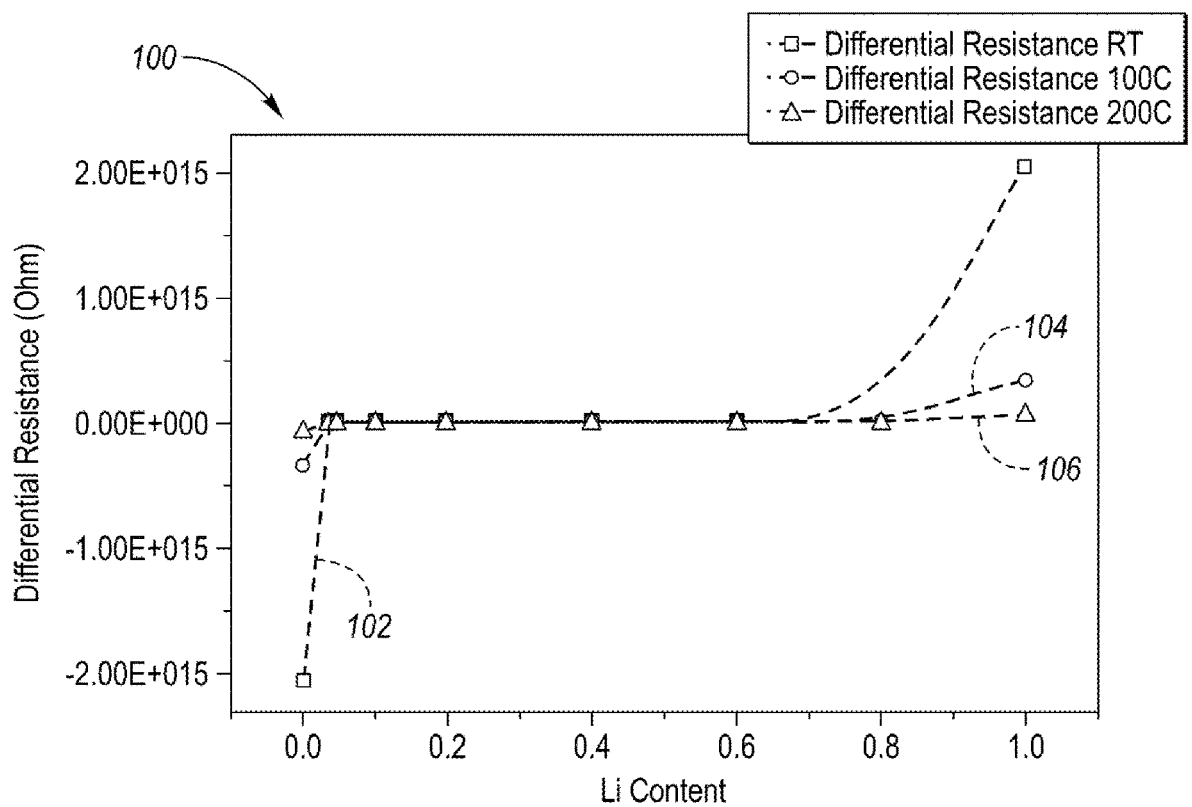
FIG. 3 depicts a graph depicting differential resistance in Ohms of the ionic transistor as shown in FIG. 1 where the upper and lower storage layers are comprised of $Li_xMO_y$ materials.

FIG. 3 depicts graph 100 depicting differential resistance in Ohms of ionic transistor 10 where upper and lower storage layers 40 and 42 are comprised of a material having a formula $Li_{0.5-n}MO_x$, where M is a transition metal, and a material having a formula $Li_{0.5+n}MO_x$, respectively. Graph 100 depicts resistance in Ohms on the y-axis as a function of Li content in lower storage layer 42 between 0 and 1 on the x-axis. Graph 100 includes curves 102, 104 and 106. Curve 102 depicts differential resistance as a function of Li content of lower storage layer 42 at room temperature (e.g. 25° C.). Curve 104 depicts differential resistance as a function of Li content of lower storage layer 42 at 100° C.

Curve 106 depicts differential resistance as a function of Li content of lower storage layer 42 at 200° C. FIG. 3 depicts three different states of ionic transistor 10 as described below in Table 1. As can be seen by Table 1, the state reading is temperature independent.

TABLE 1

| Li Content in Lower Storage Layer | Differential Resistance | Ionic Transistor Reading (25° C.) | Ionic Transistor Reading (200° C.) |
|---|---|---|---|
| Li < 0.5 | Difference > 0 | State 1 | State 1 |
| Li = 0.5 | Difference = 0 | State 2 | State 2 |
| Li > 0.5 | Difference < 0 | State 3 | State 3 |

Figure 4:
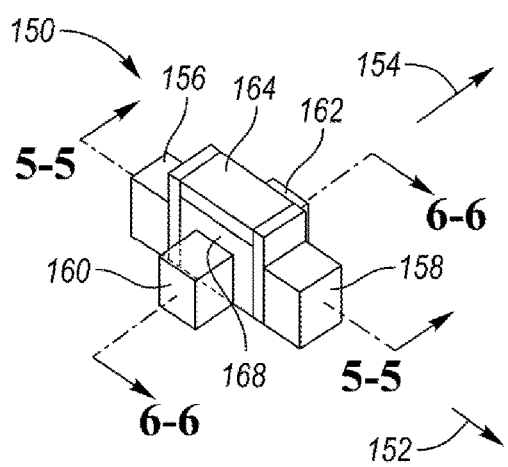
FIG. 4 depicts a schematic, perspective view of an ionic transistor according to a second embodiment.
Figure 5:
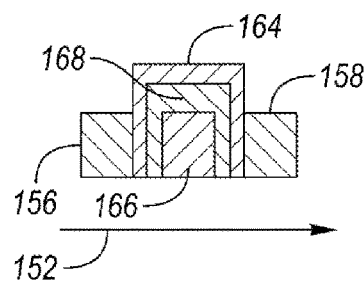
FIG. 5 depicts a schematic, cross-section view of the ionic transistor shown in FIG. 4 taken along line 5-5 of FIG. 4.
Figure 6:
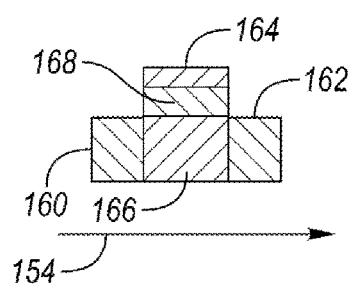
FIG. 6 depicts a schematic, cross-section view of the ionic transistor shown in FIG. 4 taken along line 6-6 of FIG. 4.

FIG. 4 depicts a schematic, perspective view of ionic transistor 150. FIG. 5 depicts a schematic, cross-section view of ionic transistor 150 taken along line 5-5 of FIG. 4. FIG. 6 depicts a schematic, cross-section view of ionic transistor 150 taken along line 6-6 of FIG. 4.

Ionic transistor 150 may be oriented along first and second axes 152 and 154. Ionic transistor 150 includes first contacts 156 and 158 oriented along first axis 152. First contacts 156 and 158 may be formed of an electrically conductive material, such as a metal material. Ionic transistor 150 further includes second contacts 160 and 162 oriented along second axis 154. Second contacts 160 and 162 may be formed of an electrically conductive material, such as a metal material. First contacts 156 and 158 may be a first source contact and a first drain contact, respectively. Second contacts 160 and 162 may be a second source contact and a second drain contact, respectively.

Ionic transistor 150 also includes first and second storage layers 164 and 166. Ionic transistor also includes solid electrolyte 168. First storage layer 164 contacts first contacts 156 and 158. First storage layer 164 does not contact second contacts 160 and 162. Second storage layer 166 contacts second contacts 160 and 162. Second storage layer 166 does not contact first contacts 156 and 158. Solid electrolyte 168 extends between first and second storage layers 164 and 166.

First and second storage layers 164 and 166 may be formed of an electrically conductive material that is configured to conduct ions (e.g. positive hydrogen ions). The electrically conductive material may be configured to demonstrate electronic conductivity with different ion concentrations. The electrically conductive material may be a lithium (Li) containing compound (e.g. a composition having a formula $Li_xMO_y$, where M is a transition metal, x is the number of Li atoms in the composition and y is the number of O atoms in the composition), a sodium (Na) containing compound (e.g. a composition having a formula $Na_xMO_y$, where M is a transition metal, x is the number of Na atoms in the composition and y is the number of O atoms in the composition), an oxygen ionic conductor (e.g. a material having an $ABO_3$ perovskite cubic structure, where the type A atom sits at a cube corner position (0, 0, 0), the type B atoms sits at a body-center position (½, ½, ½), and the O atoms sit at face centered positions (½, ½, 0), (½, 0, ½) and (0, ½, ½), or a binary transition metal oxide having a general formula $AO_x$) or combination thereof. The Li containing compound may have any of the following formulations: Li—Ti—O (e.g. $Li_7Ti_5O_{12}$), Li—Mn—O (e.g. $LiMnO_2$), Li—Ni—O (e.g. $LiNiO_2$), Li—Co—O (e.g. $LiCoO_2$), Li—Mn—Co—Ni—O (e.g. $Li(MnNiCo)O_2$), Li—Nb—O (e.g. $LiNbO_2$), Li—V—O (e.g. $LiVO_2$), Li—Fe—F (e.g. $LiFeF_3$), and combinations thereof. The Na containing compound may have any of the following formulations: Na—V—P—O (e.g. $NaV_2(PO_4)_3$), Na—Ti—O (e.g. $NaTiO_2$), and combinations thereof. Non-limiting examples of $ABO_3$ perovskite cubic structures include $La_{0.8}Sr_{0.2}MnO_3$, $La_{0.6}Sr_{0.4}Co_{0.2}Fe_{0.8}O_3$, $Gd_{0.1}Ce_{0.9}O_2$, $Sm_{0.2}Ce_{0.8}O_{0.2}$, and $SrCoO_3$. Non-limiting examples of binary transition metal oxides includes $FeO_x$, $TiO_x$, NiO and combinations thereof. First and/or second storage layers 164 and/or 166 may be formed of any mixed conducting material configured for ionic movement, including without limitation oxygen-conducting materials, sodium-conducting materials, potassium-conducting materials and combinations thereof.

In one embodiment, one of first and second storage layers 164 and 166 is formed of a material having a formula $Li_{0.5-n}MO_x$, where M is a transition metal, and the other of first and second storage layers 164 and 166 is formed of a material having a formula $Li_{0.5+n}MO_x$.

Solid electrolyte 168 is configured to contact first and second storage layers 164 and 166. Solid electrolyte 168 is configured to conduct ions (e.g. positive hydrogen ions) from and to first and second storage layers 164 and 166. In one or more embodiments, solid electrolyte 168 is an electrical insulator configured to prevent electrons from passing therethrough but allowing ions to pass therethrough. Solid electrolyte 166 may be a high dielectric constant material (e.g. relative permittivity of 3.9 to 250,000). The high dielectric constant material may be a Li conductor an oxygen ionic conductor material and combinations thereof. The Li containing material may be $Li_7La_3Zr_2O_{12}$, $LiAlO_2$, LiF, LiI, LiBr, $Li_7P_2S_7$, $Li_7P_2SI_6$ or a combination thereof. The oxygen ionic conductor material may be $Y_{0.16}Zr_{0.92}O_2$.

First storage layer 164 may be a gate or a portion of a gate (e.g. a floating gate). In one or more embodiments, ionic transistor 150 is electrically connected to the gate. The gate may be electrically connected to a switch (not shown). The switch may be electrically connected to a contact (not shown). A voltage source (not shown) is configured to apply a voltage pulse to the contact, thereby applying the voltage pulse to the switch, which in turn applies the voltage pulse to ionic transistor 150.

When a positive voltage is applied as a write voltage ($V_W$), ions (e.g. Li ions in the case of a Li containing material) are transported from first storage layer 164 through solid electrolyte 168 to second storage layer 166. As ions diffuse from first storage layer 164 through solid electrolyte 168, an electronic resistance of first storage layer 164 increases and a conductance of first storage layer 164 decreases. Second storage layer 166 is configured to intercalate ions diffused from first storage layer 164 such that an electronic resistance of second storage layer 166 decreases and a conductance of second storage layer 166 increases. Accordingly, in one mode of operation, in which a positive voltage is applied to first storage layer 164, the electronic resistance and conductance of first storage layer 164 increases and decreases, respectively, while the electronic resistance and conductance of second storage layer 166 decreases and increases, respectively. This process may be reversed (i.e. reverse the ion flow and electrical characteristics of the first and second storage layers 164 and 166) by applying a negative voltage to first storage layer 164 instead of a positive voltage. The reversibility of ionic transistor 150 is configured to provide at least three (3) differential states of operation of ionic transistor 150. In one or more embodiments, the state reading is temperature independent.

Ionic transistor 150 may be operated at a low voltage (e.g. a range of 100 mV to 5 V) to reduce the amount of power consumption relative to other transistors that operate by measuring applied voltage or current. Ionic transistor 150 is configured to operate by counting an ionic charge, not limited to applying voltage or current.

As can be seen in FIGS. 5 and 6, ionic transistor 150 has a first cross-sectional profile about first axis 152 and a second cross-sectional profile about second axis 154, respectively. The first and second cross-sectional profiles are different than (e.g. asymmetrical to) each other. The asymmetrical design of ionic transistor 150 is configured to increase the packing density of ionic transistor 150 within a given volume.

Figure 7:
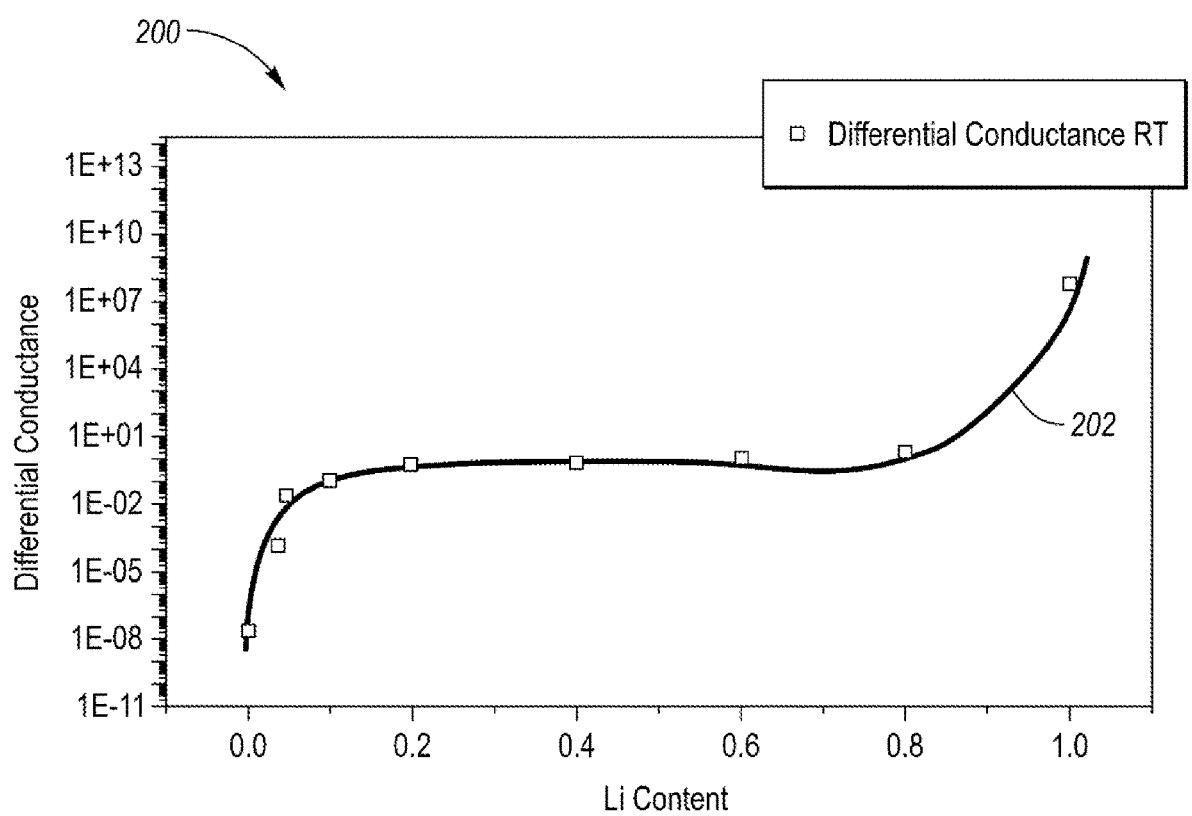
FIG. 7 depicts a graph depicting differential conductance in Siemens of the ionic transistor as shown in FIG. 4 where the first and second storage layers are comprised of $Li_xMO_y$ materials.

FIG. 7 depicts graph 200 depicting differential conductance of ionic transistor 150 where first and second storage layers 164 and 166 are comprised of a material having a formula $Li_{0.5-n}MO_x$, where M is a transition metal, and a material having a formula $Li_{0.5+n}MO_x$, respectively. Graph 200 depicts conductance in Siemens on the y-axis as a function of Li content in second storage layer 166 between 0 and 1 on the x-axis. Graph 200 includes curve 202, which depicts differential conductance as a function of Li content of second storage layer 166 at room temperature (e.g. 25° C.). As can be seen by Table 2, the state reading is temperature independent.

TABLE 2

| Li Content in Second Storage Layer | Conductance Ratio | Ionic Transistor Reading (25° C.) | Ionic Transistor Reading (200° C.) |
| --- | --- | --- | --- |
| Li < 0.5 | Ratio > 1 | State 1 | State 1 |
| Li = 0.5 | Ratio = 1 | State 2 | State 2 |
| Li > 0.5 | Ratio < 1 | State 3 | State 3 |

FIGS. 8a, 8b and 8c depict schematic diagrams of an analog multiply-accumulate unit configured to implement the ionic transistors of one or more embodiments. The analog multiply-accumulate unit may be configured as a neuromorphic computing system based on non-volatile memory implemented as one or more of the ionic transistors of one or more embodiments. FIG. 8a depicts schematic representation 250 of a one-layer neural network with synaptic weights (W) 252 connecting input layer 254 to output layer 256. As shown by schematic representation 258 of FIG. 8b, a synaptic weight is represented as a conductance value 260 of a non-volatile memory element at a cross-point 262 in crossbar array structure 264. FIG. 8c depicts a vector-matrix multiplication 266 performed by sensing the current (I) for each column of crossbar array structure 264, which is the product of the synaptic weight (G) and the input signal (V). A neuromorphic computing system may include a matrix of ionic transistors of one or more embodiments connected through crossbar array structure 264 shown in FIG. 8b.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. An ionic transistor comprising:
    a first source;
    a first drain spaced apart from the first source;
    a first storage layer electrically connected to the first source and drain;
    a second source spaced apart from the first source;
    a second drain spaced apart from the second source;
    a second storage layer electrically connected to the second source and drain; and
    an electrolyte layer situated between and electrically connected to the first and second storage layers, the first and/or second storage layers include a sodium ionic conductor including a Na—V—P—O compound, a Na—Zr—Si—P—O compound, a Na—Ti—O compound or a combination thereof.

2. The ionic transistor of claim 1, wherein the electrolyte layer includes an ionic conducting material.

3. The ionic transistor of claim 2, wherein the ionic conducting material is a lithium ionic conductor, an oxygen ionic conductor or a combination thereof.

4. The ionic transistor of claim 3, wherein the lithium ionic conductor includes $Li_7La_3Zr_2O_{12}$, $LiAlO_2$, LiF, LiI, LiBr, $Li_7P_2S_7$, $Li_7P_2SI_6$ or a combination thereof.

5. The ionic transistor of claim 1, wherein the first source and drain do not contact the second storage layer.

6. The ionic transistor of claim 1, wherein the second source and drain do not contact the first storage layer.

7. An ionic transistor comprising:
    a first source;
    a first drain spaced apart from the first source;
    a first storage layer electrically connected to the first source and drain;
    a second source spaced apart from the first source;
    a second drain spaced apart from the second source;
    a second storage layer electrically connected to the second source and drain; and
    an electrolyte layer situated between and electrically connected to the first and second storage layers, the first and/or second storage layers include an oxygen ionic conductor including an $ABO_3$ perovskite cubic structured material or a binary transition metal oxide.

8. The ionic transistor of claim 7, wherein the electrolyte layer includes a lithium ionic conductor, an oxygen ionic conductor or a combination thereof.

9. The ionic transistor of claim 8, wherein the lithium ionic conductor includes $Li_7La_3Zr_2O_{12}$, $LiAlO_2$, LiF, LiI, LiBr, $Li_7P_2S_7$, $Li_7P_2SI_6$ or a combination thereof.

10. The ionic transistor of claim 7, wherein the first source and drain do not contact the second storage layer.

11. The ionic transistor of claim 7, wherein the second source and drain do not contact the first storage layer.

12. An ionic transistor comprising:
    a first source;
    a first drain spaced apart from the first source;
    a first storage layer electrically connected to the first source and drain;

a second source spaced apart from the first source;
a second drain spaced apart from the second source;
a second storage layer electrically connected to the second source and drain; and
an electrolyte layer situated between and electrically connected to the first and second storage layers, the electrolyte layer includes an oxygen ionic conductor including $Y_{0.16}Zr_{0.92}O_2$.

13. The ionic transistor of claim 12, wherein the first source and drain do not contact the second storage layer.

14. The ionic transistor of claim 12, wherein the second source and drain do not contact the first storage layer.

15. An ionic transistor comprising:
a first source;
a first drain spaced apart from the first source;
a first storage layer electrically connected to the first source and drain;
a second source spaced apart from the first source;
a second drain spaced apart from the second source;
a second storage layer electrically connected to the second source and drain;
an electrolyte layer situated between and electrically connected to the first and second storage layers, the first drain, source and storage layer and the second drain, source and storage layer form a first substantially planar layer and a second substantially planar layer, respectively, the electrolyte layer is a substantially planar electrolyte layer separating the first and second substantially planar layers from each other; and
a first coating layer situated between the first substantially planar layer and the substantially planar electrode layer and/or a second coating layer situated between the second substantially planar layer and the substantially planar electrolyte layer.

16. The ionic transistor of claim 15, wherein a thickness of the first and/or second coating layers is 1 to 2 nanometers.

17. The ionic transistor of claim 15, wherein the first and/or second coating layers include a coating material of LiF, $Li_2O$, $Li_2O_2$ or a combination thereof.

18. The ionic transistor of claim 15, wherein the first source and drain do not contact the second storage layer.

19. The ionic transistor of claim 15, wherein the second source and drain do not contact the first storage layer.

20. The ionic transistor of claim 15, wherein the electrolyte layer includes an ionic conducting material.

* * * * *